United States Patent
Akaike et al.

(10) Patent No.: US 9,225,347 B2
(45) Date of Patent: Dec. 29, 2015

(54) OSCILLATOR

(71) Applicant: NIHON DEMPA KOGYO CO., LTD., Tokyo (JP)

(72) Inventors: Kazuo Akaike, Saitama (JP); Tsukasa Kobata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/226,828

(22) Filed: Mar. 27, 2014

(65) Prior Publication Data

US 2014/0292416 A1    Oct. 2, 2014

(30) Foreign Application Priority Data

Mar. 29, 2013  (JP) ................................. 2013-074621

(51) Int. Cl.
| | |
|---|---|
| H03L 7/099 | (2006.01) |
| H03L 7/083 | (2006.01) |
| H03L 7/06 | (2006.01) |
| H03L 7/24 | (2006.01) |

(52) U.S. Cl.
CPC ........... *H03L 7/099* (2013.01); *H03L 7/06* (2013.01); *H03L 7/083* (2013.01); *H03L 7/24* (2013.01)

(58) Field of Classification Search
CPC ............. H03L 7/06; H03L 7/083; H03L 7/24; H03L 7/099
USPC .......... 331/16, 18, 23, 25, 1 A; 327/105, 106, 327/107
See application file for complete search history.

(56) References Cited

U.S. PATENT DOCUMENTS

| | | | | |
|---|---|---|---|---|
| 5,079,521 | A * | 1/1992 | Gaskell et al. | 331/1 A |
| 5,563,535 | A * | 10/1996 | Corry et al. | 327/105 |
| 6,234,658 | B1 * | 5/2001 | Houldsworth | 716/101 |
| 6,717,998 | B2 * | 4/2004 | Kosugi et al. | 375/376 |
| 7,577,695 | B2 * | 8/2009 | Dai | 708/271 |
| 2002/0043992 | A1 * | 4/2002 | McCune et al. | 327/105 |
| 2005/0073368 | A1 * | 4/2005 | Owen et al. | 331/16 |

FOREIGN PATENT DOCUMENTS

| | | |
|---|---|---|
| JP | 2012-170050 | 9/2012 |
| JP | 2012-195932 | 10/2012 |
| JP | 2013-098872 | 5/2013 |

\* cited by examiner

*Primary Examiner* — Richard Tan
(74) *Attorney, Agent, or Firm* — Jianq Chyun IP Office

(57) ABSTRACT

An oscillator configured to obtain a frequency output corresponding to a frequency setting value includes: an oscillation circuit portion that receives the frequency setting value; a setting value output portion that outputs a digital value for designating the frequency setting value; an interpolation circuit portion that performs interpolation for a digital value of lower-order bits out of the digital value output from the setting value output portion; and an adder that adds an output of the interpolation circuit portion and a digital value of higher-order bits out of the digital value output from the setting value output portion, wherein a signal output from the interpolation circuit portion is sequential data having first and second values different from each other, and output counts of the first and second values are determined based on a ratio corresponding to the digital value of the lower-order bits.

7 Claims, 8 Drawing Sheets

| REGISTER INPUT | REGISTER OUTPUT (G2) |
|---|---|
| 000 | $2^{-0}$ |
| 001 | $2^{-1}$ |
| 010 | $2^{-2}$ |
| 011 | $2^{-3}$ |
| 100 | $2^{-4}$ |
| 101 | $2^{-5}$ |
| 110 | $2^{-6}$ |
| 111 | $2^{-7}$ |

FIG. 2

| ADDRESS | DATA |
|---|---|
| A0 | D0 |
| A1 | D1 |
| A2 (FIRST REGISTER) | D2 |
| A3 | D3 |
| A4 (SECOND REGISTER) | D4 |
| A5 | D5 |
| A6 | D6 |
| A7 (THIRD REGISTER) | D7 (G1) |
| A8 (FOURTH REGISTER) | D8 (G2) |
| ⋮ | ⋮ |

OSCILLATOR

CROSS-REFERENCE TO RELATED APPLICATIONS

This application claims the priority benefit of Japanese application serial no. 2013-074621, filed on Mar. 29, 2013. The entirety of the above-mentioned patent application is hereby incorporated by reference herein and made a part of specification.

TECHNICAL FIELD

This disclosure relates to an oscillator that oscillates at a frequency corresponding to a frequency setting signal.

DESCRIPTION OF THE RELATED ART

As a representative crystal oscillator, there is known a crystal oscillator using a Colpitts circuit. Adjustment of an oscillation frequency of the crystal oscillator is performed by changing a voltage applied to a varicap diode to change a capacitance. FIG. 10 illustrates an exemplary relationship between the control voltage and the oscillation frequency. A variable width of the oscillation frequency depends on a linear curve area between a voltage and a capacitance of the varicap diode. However, in a method of adjusting a frequency based on an analog voltage, it is difficult to perform an accurate frequency control and obtain high frequency stability because of some problems such as instability of an analog DC voltage or an output noise problem caused by a noise in a control signal line. In addition, in the frequency adjustment based on an analog control, it is necessary to suppress a variation in a device characteristic in order to increase adjustment accuracy. However, in order to reduce such a variation in the characteristic, a cost of the device tends to increase.

When a variable capacitance element is used, there are problems such as a limitation of frequency adjustment caused by a non-linear area of the variable capacitance element or a variation of the frequency caused by aging of the variable capacitance element. Meanwhile, in the fields requiring high frequency stability, such as a global positioning system (GPS), an allowable frequency change ratio may have an order of "$10^{-9}$." Such a requirement is not easy to satisfy.

In Japanese Unexamined Patent Application Publication No. 2012-170050, there is discussed a method of adjusting an oscillation frequency by generating a reference pulse input to a phase-locked loop (PLL) using a direct digital synthesizer (DDS) and inputting a digital value of a frequency setting value corresponding to the oscillation frequency of an oscillation circuit portion into the DDS. Meanwhile, a user may desire to set a frequency with high accuracy within a usable range of the oscillation frequency allowed to the user or obtain a high resolution in the frequency setting. A variable frequency range desired by a user may be different case by case. However, a manufacturer may desire to suppress a circuit size as small as possible while there is a request for generalizing a product hardware configuration and obtaining a high frequency setting resolution.

Thus, a need exists for an oscillator capable of adjusting a frequency with high accuracy and obtaining a high resolution of the setting frequency while suppressing a circuit size.

SUMMARY OF THE INVENTION

According to another aspect of this disclosure, there is provided an oscillator configured to receive a frequency setting value input to an oscillation circuit portion and obtain a frequency output corresponding to the frequency setting value from the oscillation circuit portion, including: a setting value output portion that outputs a value for designating the frequency setting value as a digital value; an interpolation circuit portion that performs interpolation for a digital value of lower-order bits out of the digital value output from the setting value output portion; and an adder that adds an output value of the interpolation circuit portion and a digital value of higher-order bits out of the digital value output from the setting value output portion to output an addition value for designating the frequency setting value, wherein a signal output from the interpolation circuit portion is sequential data having first and second values different from each other and output in synchronization with a clock signal, and output counts of the first and second values are determined based on a ratio corresponding to the digital value of the lower-order bits.

According to an embodiment disclosed here, the value for designating the frequency setting value is output as a digital value. Therefore, unlike a case where a frequency is set based on an analog DC voltage, it is possible to address problems such as instability of a voltage or a noise problem in the output caused by a noise of a control signal line. Accordingly, it is possible to perform an accurate frequency control and obtain high frequency stability.

In addition, the digital value for designating the frequency setting value is divided into higher-order bits and lower-order bits, and first and second values different from each other are output in synchronization with a clock signal. The first and second values are added to the higher-order bits, and each of the output counts of the first and second values is determined based on a ratio corresponding to the digital value of lower-order bits. Therefore, roughly speaking, even when the resolution of the setting frequency of the higher-order bits is set to, for example, "1 ppm," the setting frequency changes, for example, between a value obtained by adding the first value and a value obtained by adding the second value for one second with respect to a value determined by "1 ppm" chopping.

For this reason, the setting frequency for one second can be regarded as an average of the addition values. Now, for example, it is assumed that the oscillator outputs a frequency of 10 MHz, and one bit of the higher-order bits changes from "10000000 Hz" to "10000010 Hz." In addition, if the first value is set to "+1," the second value is set to "4," and the ratio between the output counts of the first and second values is set to 75%, the average oscillator frequency for one second becomes "{9999990(Hz)×1+10000010(Hz)×3}/4=10000005 Hz." Therefore, it is recognized that the resolution increases.

The ratio between the output counts of the first and second values refers to a percentage of "(output count of first value)/(output count of the first value+output count of second value)," for example, for one second. As a result, by performing a signal processing as described above, it is possible to obtain a high resolution for the setting frequency with a smaller number of bits and suppress a circuit size.

BRIEF DESCRIPTION OF THE DRAWINGS

The foregoing and additional features and characteristics of this disclosure will become more apparent from the following detailed description considered with the reference to the accompanying drawings.

FIG. 2 is an explanatory diagram illustrating an input/output relationship of a part of registers of a variable width setting portion.

DETAILED DESCRIPTION

Figure 1:
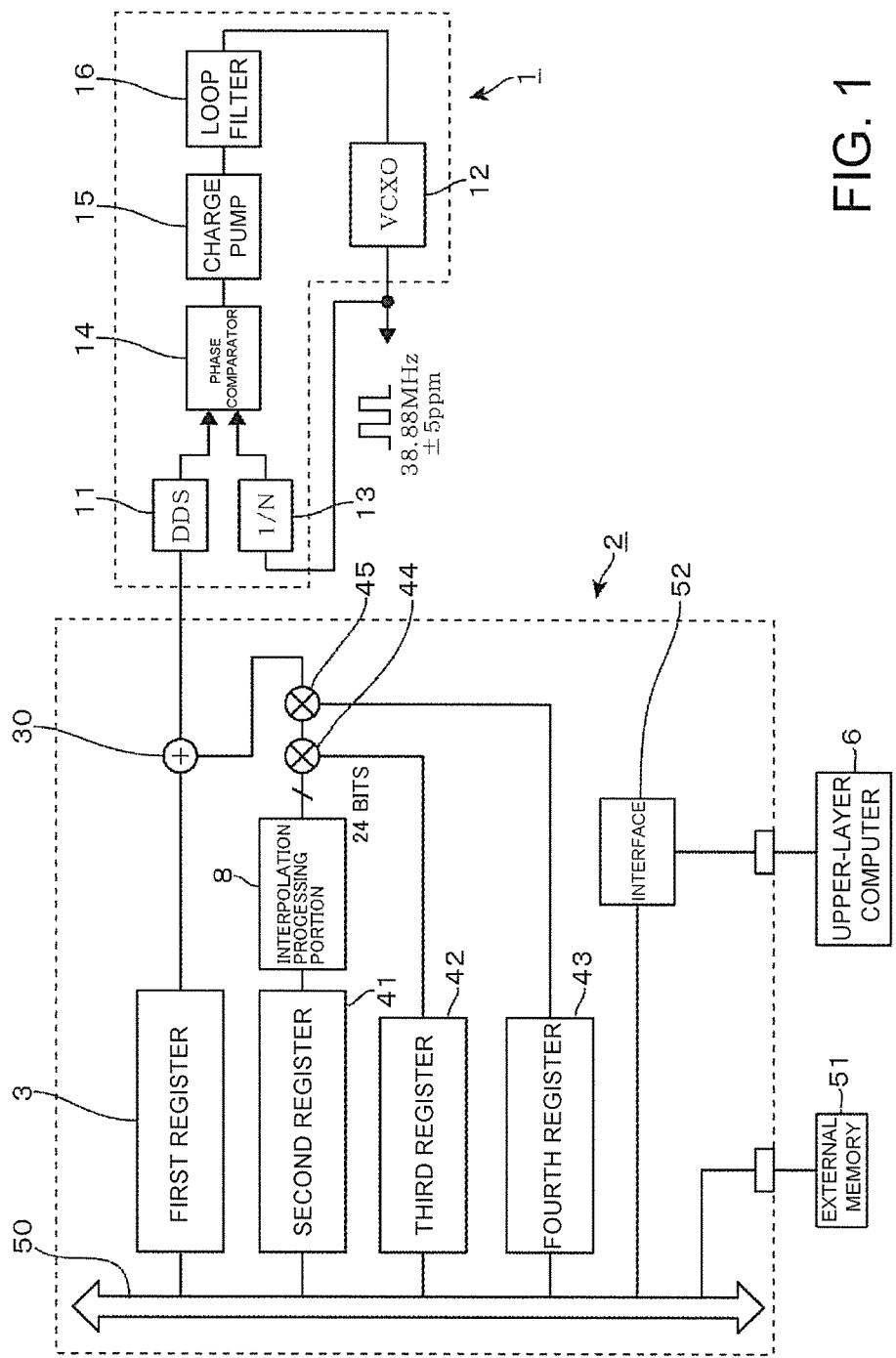
FIG. 1 is a block diagram illustrating the entire configuration of an oscillator according to an embodiment disclosed here.

FIG. 1 is a block diagram illustrating the entire configuration according to an embodiment disclosed here. The oscillator has a frequency synthesizer that output a frequency signal corresponding to a setting frequency. The frequency synthesizer includes an oscillation circuit portion 1 and a microcontroller 2 that outputs parameters necessary in the operation of the oscillation circuit portion 1 and serves as a controller for controlling the oscillation circuit portion 1.

The oscillation circuit portion 1 has a direct digital synthesizer (DDS) 11. The DDS 11 receives frequency data (digital value) as a frequency setting signal and outputs a frequency signal corresponding to the frequency data. For example, there is known a DDS that generates a sawtooth wave corresponding to the frequency data based on a digital value and outputs a rectangular wave whenever a negative digital value changes to a positive digital value (zero-cross point) out of the training digital values of the sawtooth wave.

The frequency signal as a rectangular wave output from the DDS 11 is a reference clock. Therefore, the DDS 11 serves as a reference clock output portion. Meanwhile, an output of the voltage-controlled oscillator 12 as a part of the oscillation circuit portion 1 is divided by a divider 13, so that a phase of the pulse output from the divider 13 and a phase of the reference clock are compared in a phase comparator 14. A phase difference as the comparison result of the phase comparator 14 changes to an analog value using a charge pump 15, and the analog signal is input to the loop filter 16 and is then integrated therein. In addition, the output of the loop filter 16 is input to the voltage-controlled oscillator 12 as a control voltage, and the control is performed to stabilize a phase-locked loop (PLL). A frequency corresponding to the frequency of the reference clock, for example, in this example, a pulse signal having a frequency obtained by multiplying "N" (where "N" denotes a denominator of a division ratio) by the frequency of the reference clock is output as the output signal of the frequency synthesizer from the voltage-controlled oscillator 12.

Next, the microcontroller 2 will be described. The microcontroller 2 has a functionality of setting a frequency of the frequency synthesizer. The frequency synthesizer according to an embodiment disclosed here is configured to change a normal frequency determined by the manufacturer within a variable width set by the manufacturer. The variable width is expressed as a ratio (ppm) with respect to the normal frequency. For example, the variable width is set to, for example, a ratio with the same negative and positive widths from the normal frequency. Specifically, the variable width may be expressed as "normal frequency ±5 ppm." Therefore, a user of the frequency synthesizer can adjust a frequency within this variable width range. In other words, a manufacturer of the frequency synthesizer sets the variable width in response to a user's request.

Reference numeral "3" denotes a first register corresponding to a normal frequency output portion. The first register 3 sets the normal frequency as, for example, a 32-bit digital value (digital data).

Reference numeral "41" denotes a second register as a frequency adjustment factor output portion. The second register 41 sets a frequency adjustment factor as a 24-bit digital value (digital data) expressed as 2's complement. The second register 41 corresponds to a frequency setting value output portion in this example. The frequency adjustment factor is to allow a user to set a ratio with respect to the normal frequency out of the variable width range set by a manufacturer. If this frequency adjustment factor is determined, a frequency corresponding to this ratio is added to the normal frequency as described below so that its addition value becomes frequency data as a frequency setting signal.

An interpolation processing portion 8 for performing interpolation for the digital value output from the second register 41 is provided in rear of the second register 41. In order to facilitate description for easy understanding of the embodiment, it is assumed in the following description that the interpolation processing portion 8 is omitted before the interpolation processing portion 8 is described. Then, the interpolation processing portion 8 will be described in detail.

The microcontroller 2 is provided with a gain output portion for setting a gain for the frequency adjustment factor set by the second register 41. The gain output portion includes a third register 42 corresponding to a first gain output portion for setting a first gain G1 and a fourth register 43 corresponding to a second gain output portion for setting a second gain G2. Reference numerals "44" and "45" denote multipliers.

The gains G1 and G2 are determined such that the minimum value of the frequency adjustment factor set by the second register 41 corresponds to a lower limit (for example, "−5 ppm") of the variable width, and the maximum value of the frequency adjustment factor set by the second register 41 corresponds to an upper limit (for example, "+5 ppm") of the variable width. That is, as the frequency adjustment factor is shifted from the minimum value to the maximum value, a value of "frequency adjustment factor×G1×G2" changes, for example, from "−5 ppm" to "+5 ppm."

The first gain G1 is an 8-bit digital value, for example, expressed as 2' complement.

The second gain G2 is a value for a rounding processing (multiplication of 2', where "n" denotes any natural number) for a value obtained by multiplying the first gain G1 by the frequency adjustment factor. The fourth register 43 receives a 3-bit digital value as an input, selects a value corresponding to the input value out of a set of values $\{2^0, 2^{-3}, 2^{-6}, 2^{-8}, 2^{-9},$ $2^{-10}$, $2^{-11}$, and $2^{-12}$} as the gain G2, and outputs the result. A relationship between the 3-bit digital value and the gain G2 is illustrated in FIG. 2.

The frequency adjustment factor, the variable width, and the gains G1 and G2 will be described in more detail. Assuming that the normal frequency is set to "38.88 MHz," the digital value corresponding to this normal frequency is "128792027777," and the variable width is set to "±5 ppm," a digital value of the first register 3 corresponding to "5 ppm" of "38.88 MHz" is "643960." Since a 24-bit maximum value expressed as 2's complement in the second register 41 is "8388608-1," it is possible to set to the variable width to "±5 ppm" by obtaining the gains G1 and G2 satisfying a condition that the output value of the multiplier 45 becomes "643960" when the 24-bit digital value is at maximum. In this case, the gain G1 becomes "79," and the gain G2 becomes "$2^{-10}$."

Reference numeral "30" denotes an adder. The adder 30 adds the digital value corresponding to the normal frequency set in the first register 3 and the digital value from the multiplier 45. In the example described above, when the frequency adjustment factor output portion 41 sets "−8388608" which is the minimum value of the digital value expressed as 2' complement, the digital value (frequency setting data) obtained from the adder 30 is obtained by subtracting the frequency ("38.88 MHz"×"5/1,000,000") corresponding to "5 ppm" from "38.88 MHz." In addition, when the frequency adjustment factor output portion 41 sets "8388608-1" which is the maximum value, the digital value (frequency setting data) obtained from the adder 30 becomes a value obtained by adding or subtracting the frequency (38.88 MHz×5/1,000,000) corresponding to "5 ppm" to or from the frequency of "38.88 MHz."

Figure 3:
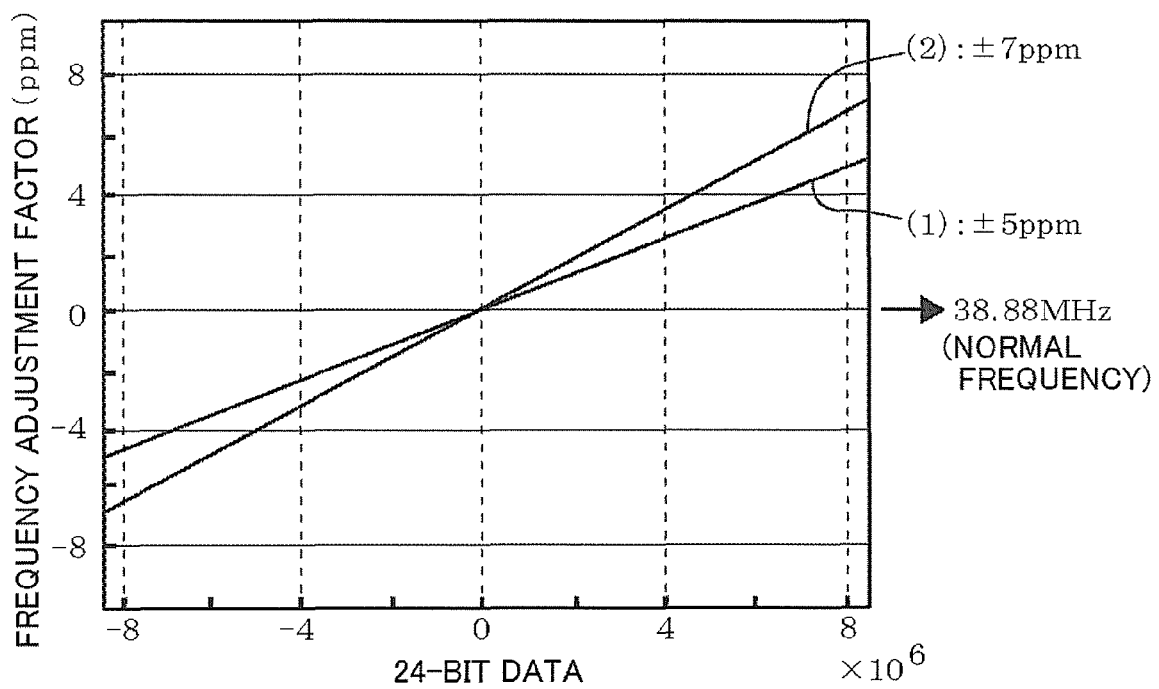
FIG. 3 is a characteristic diagram illustrating a relationship between a digital value corresponding to a frequency adjustment factor and a change rate with respect to a normal frequency.

That is, using the frequency adjustment factor of the frequency adjustment factor output portion 41, it is possible to set a frequency matching the digital value out of the variable frequency width corresponding to (38.88 MHz±(frequency corresponding to "5 ppm")). FIG. 3 illustrates a frequency adjustment factor (ratio of the frequency with respect to the normal frequency) when the digital value set by the frequency adjustment factor output portion 41 changes from the minimum value to the maximum value. In the curve (1), the variable width is set to "±5 ppm." In the curve (2), the variable width is set to "±7 ppm."

Returning to FIG. 1, the microcontroller 2 is connected to a non-volatile memory, for example, an external memory 51 including an electrically erasable programmable ROM (EEPROM). Reference numeral "50" denotes a bus. In addition, the microcontroller 2 has an interface 2 capable of steady communication with an upper-layer computer 6. A standard of the interface 52 may include, for example, "I2C interface" or "RS232" as a standard specification of a serial interface. It is noted that the interface 52 may also be a parallel interface.

Figures 4, 5:
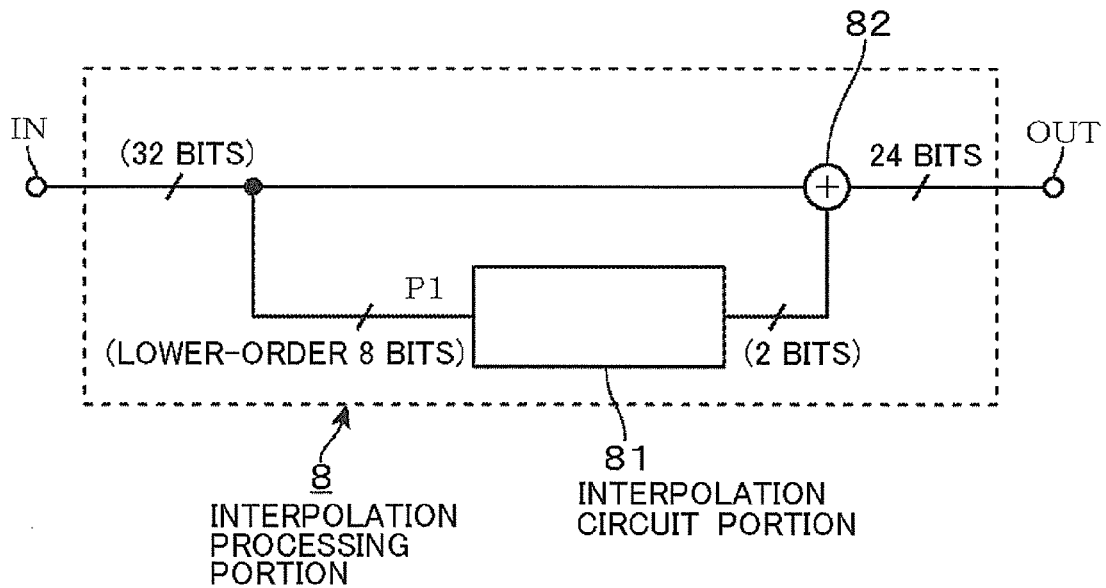
FIG. 4 is an explanatory diagram obtained by matching data and addresses of registers used in the embodiment disclosed here.
FIG. 5 is a block diagram illustrating an interpolation circuit portion used in the embodiment disclosed here.

The external memory 51 stores setup information of each oscillator. The setup information contains various parameters necessary in the oscillation circuit portion 1, a part number, and the like. The setup information also contains the digital values stored in the first to fourth registers 3, 41, 42, and 43. The setup information is written to the external memory 51 from an upper-layer computer 6 using an interface 52 by a manufacturer. In this example, addresses allocated to the first to fourth registers 3, 41, 42, and 43 match addresses allocated to the normal frequency in the external memory 51, the frequency adjustment factor, the first and second gains G1 and G2. For example, assuming that the address of the external memory 51 allocated to the normal frequency is set to "A2," the address allocated to the first register 3 is also "A2." FIG. 4 is a schematic diagram illustrating a table representing a matching relationship between the address of the external memory 51 and the stored data.

Next, the interpolation processing portion 8 will be described. FIG. 5 is a block diagram illustrating the interpolation processing portion 8. The interpolation processing portion 8 includes an input port IN that receives a 32-bit digital value and an interpolation circuit portion 81 that receives a 8-bit digital value having an order lower than that of the "32 bits" and outputs sequential data containing a group of numbers as a digital signal training in a sequential manner corresponding to the input digital value. The group of numbers refers to a signal training in a sequential manner including first and second different values output in response to a clock signal at a predetermined time.

The adder 82 is a circuit configured to add a group of numbers output from the interpolation circuit portion 81 and a 24-bit digital value having an order higher than the "32 bit." The output port OUT outputs a 24-bit digital value.

The interpolation circuit portion 81 includes a delta-sigma circuit portion that generates a pulse width modulation (PWM) signal for maintaining an average duty ratio at a value corresponding to the 8 bit digital value for a predetermined time and a circuit portion configured to output the group of numbers in response to the PWM signal. The group of numbers includes a 2-bit digital value "01" (decimal number "+1") as 2's complement and a digital value "11" (decimal number "−1") as 2's complement. For example, "01" is output when the PWM signal has a high level H, and "11" is output when the PWM signal has a low level L. In this example, "01" is set as the first value, and "11" is set as the second value.

The timing that the interpolation circuit portion 81 outputs "11" or "01" is synchronized with the timing that the adder 82 performs addition. For example, the clock pulse for outputting each of the group of numbers from the interpolation circuit portion 81 is commonalized with the clock for performing the addition.

The functionality of the interpolation processing portion 8 will be described. For example, it is assumed that a resolution of the frequency adjustment factor in the 24-bit digital value output from the second register 41 is set to 15 ppt/bit when the interpolation processing portion 8 is not provided. In this case, if the 24-bit digital value output from the second register 41 changes to "0", "1", "2", "3", . . . , and so on in a decimal expression, the frequency adjustment factor changes to 0 ppt, 15 ppt, 30 ppt, 45 ppt, . . . , and so on. In comparison, if the interpolation processing portion 8 receives the 32-bit digital value and outputs the 24-bit frequency adjustment factor as described above, the 24-bit digital value is incremented or decremented by "1."

For example, assuming that the 24-bit digital value "2" is output from the second register 41, the addition value of the adder 82 becomes "1" or "3." If the aforementioned ratio {(output count of "01")/(output count of "01"+output count of "11")} between the 2-bit digital value "01" (decimal number "+1") as 2's complement and the digital value "11" (decimal number "−1") as 2's complement output from the interpolation circuit portion 81 is set to 50%, the adder 82 alternately outputs "1" and "3." For this reason, for example, the voltage-controlled oscillator 12 outputs a pulse of the oscillation frequency corresponding to the frequency adjustment factor between "15 ppt" and "45 ppt" for one second. This is substantially equivalent to the frequency adjustment factor of 30 ppt. The inventors recognized that there is no spurious result such as an adverse effect in the output of the voltage-controlled oscillator 12 even when the setting is made as described above.

For example, if the aforementioned ratio is "40%," a ratio between the output count of "3" and the output count of "1" becomes "4:6," which is equivalent to "1.8" as an average value of the addition value of the adder 82 and is equivalent to "27 ppt" as the frequency adjustment factor. Therefore, the resolution is improved while a 24-bit digital value is used. Since the resolution of the aforementioned ratio of the interpolation processing portion 8 is determined by an 8-bit digital value, the resolution of the frequency adjustment factor is improved by "15 ppt/$2^8$=0.058 ppt/bit." Therefore, when a frequency range is set in the second register 41 using the upper-layer computer 6, the frequency adjustment factor expressed as the aforementioned resolution is input to an input screen.

Next, the effects of the aforementioned embodiment will be described. First, when an oscillator manufacturer manufactures an oscillator, necessary parameters are written to the external memory 51 using the upper-layer computer 6. The parameters include a normal frequency, gains G1 and G2, and the like as described above. The setting of the normal frequency is performed as follows. A digital value as a frequency setting signal is input from the first register 3 to the DDS 11 of the oscillation circuit portion 1, and an output frequency of the oscillation circuit portion 1 is measured using a frequency measurement device. Then, the digital value when the output frequency reaches the normal frequency is written to the external memory 51 as a setting value of the normal frequency. In this case, the second register 41 stores zero as the digital value.

As the digital value of the first register corresponding to the normal frequency is determined, the gain G1 of the third register 42 and the gain G2 of the fourth register 43 are determined as described in detail in the aforementioned example, in which the normal frequency is "38.88 MHz," and the digital value corresponding to the normal frequency is "128792027777." A manufacturer determines a variable width (variable ratio) with respect to the normal frequency, for example, depending on a user's request, and the gains G1 and G2 are determined depending on the variable width. Such a value is input to the interface 52 as a serial signal from the upper-layer computer 6. Here, the serial signal is converted into a parallel signal and is written to the external memory 51.

As the gains G1 and G2 are determined in this manner, a full range of the digital value stored in the second register 41 corresponds to a variable width, for example, ±5 ppm. Accordingly, it is possible adjust the output frequency by adjusting this digital value, for example, as illustrated in FIG. 3. For example, a manufacture may set the frequency adjustment factor to zero, and a user may set the out frequency to a desired value within a range of the variable width set by the manufacturer.

That is, a user rewrites the data of the second register 41 as a necessary frequency adjustment factor using the interface 52 from the upper-layer computer 6. It is noted that, similar to other parameters, the frequency adjustment factor to be written to the second register 41 may be once written to the external memory 51 from the upper-layer computer 6 using the interface 52 and then read to the second register 41 when power is turned on.

Then, as the oscillator is powered on, the parameters in the external memory 51 are read and written to the corresponding register based on a program stored in the microcontroller 2. A digital value corresponding to the normal frequency is output from the first register 3. The digital value stored in the second register 41 can be adjusted to any value by a user using the interface 52, so that the digital value corresponding to the adjustment ratio with respect to the normal frequency is output. The gains G1 and G2 are multiplied to the digital value corresponding to the adjustment ratio, so that a digital value corresponding to the frequency to be adjusted with respect to the normal frequency is obtained. The adder 30 adds this digital value and the digital value corresponding to the normal frequency, and the resulting addition value is input to the DDS 11 of the oscillation circuit portion 1 as a frequency setting signal. Then, a desired output frequency is obtained from the oscillation circuit portion 1 by performing the operation as described above.

Figure 6:
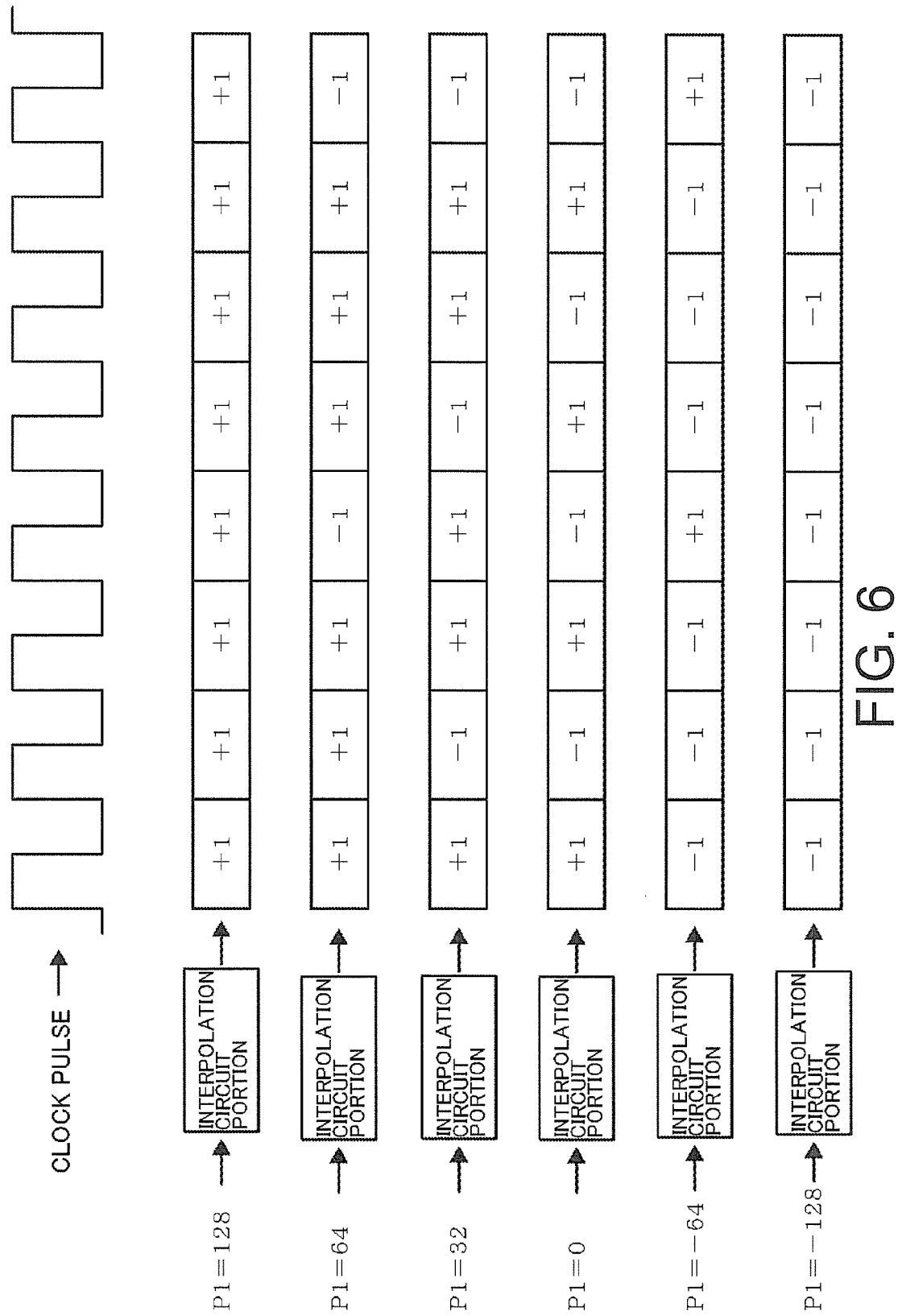
FIG. 6 is a timing chart illustrating a relationship between a lower-order 8-bit value input to the interpolation circuit portion and an output value from the interpolation circuit portion.

Here, FIG. 6 illustrates a state that the frequency adjustment factor as an adjustment ratio with respect to the normal frequency is output based on the 32-bit digital value output from the second register 41. FIG. 6 is illustrated schematically for intuitive understanding. FIG. 6 illustrates a case where the decimal number P1 of the 8-bit digital value input to the interpolation circuit portion 81 is set to the maximum value "128," a case where the decimal number P1 is set to "64," "32," "0," and "−64," and a case where the decimal number P1 is set to the minimum value "−128." The clock pulse located in the top is to set a timing for outputting a 2-bit digital value "01" (decimal number "+1") as 2's complement or a digital value "11" (decimal number "−1") as 2's complement is output from the interpolation circuit portion 81.

This frequency of the clock pulse is roughly set to "8 Hz" for simplicity purposes. As illustrated in FIG. 6, the interpolation circuit portion 81 outputs "+1" and "−1" at a ratio corresponding to the lower-order 8-bit value output from the second register 41. For example, assuming that the higher-order 24 bits out of 32 bits input to the interpolation processing portion 8 represents "0," and the lower-order 8-bit value P1 is "32," the aforementioned ratio becomes 37.5%, so that "+1" is output five times, and "−1" is output three times for one second. It is noted that "−1" is output when a distribution degree of a sequence of "+1" and "−1" becomes at maximum.

Figure 7:
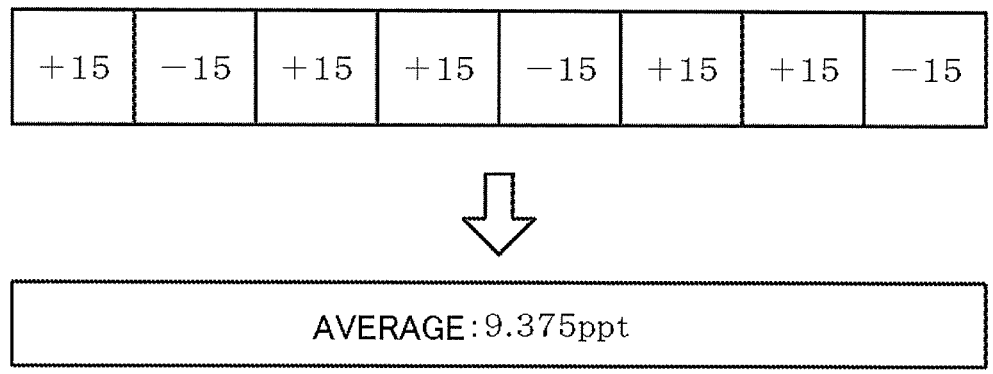
FIG. 7 is an explanatory diagram illustrating an output adjustment value of a voltage-controlled oscillator when the lower-order 8-bit value input to the interpolation circuit portion is set to "+32".

In this example, since the 24-bit value input to the adder 82 is zero, the addition value of the adder 82 is equal to the sequential data of the value output from the interpolation circuit portion 81. FIG. 7 illustrates sequential data obtained by expressing the addition value of the adder 8 using the frequency adjustment factor (ppt). Since a resolution of 24 bits is "15 ppt," "+15 ppt" corresponds to "+1," and "−15 ppt" corresponds to "−1." Therefore, in this illustrated example, the output frequency of the oscillation circuit portion is set in the unit of ⅛ second, and the voltage-controlled oscillator 12 outputs a frequency obtained by adding "+15 ppt" to the normal frequency and a frequency obtained by adding "−15 ppt" to the normal frequency depending on the sequential data of FIG. 7. As a result, an average of the oscillation frequency for one second becomes a value obtained by adding "9.375 ppt" to the normal frequency. That is, it is recognized that it is possible to set a frequency with a resolution higher than that determined by a 24-bit digital value.

Figure 8:
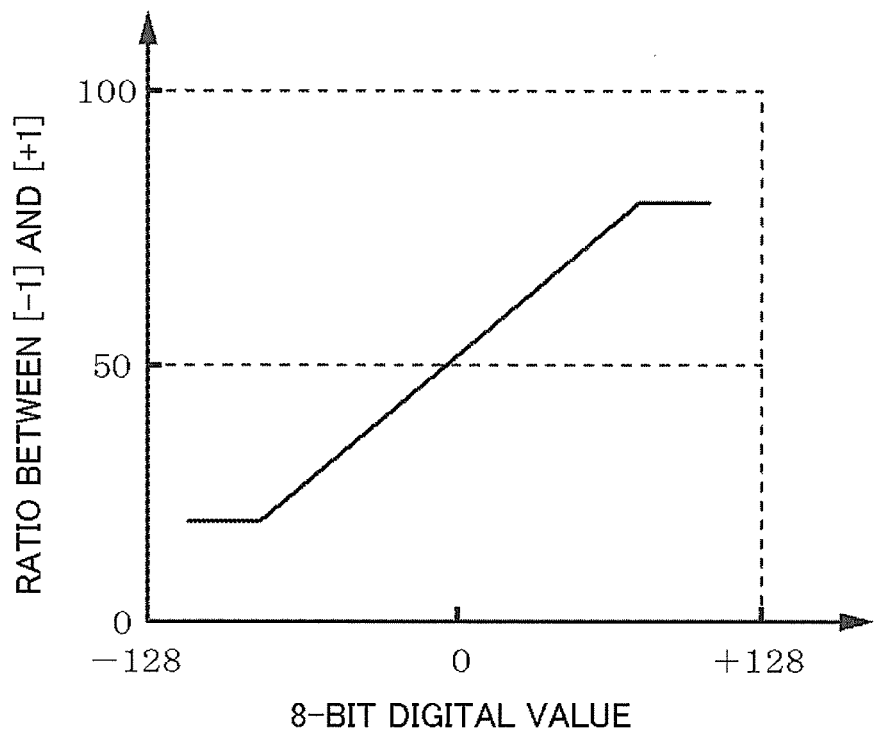
FIG. 8 is a characteristic diagram illustrating an input/output relationship of the interpolation circuit portion.

FIG. 8 illustrates an exemplary relationship between a digital value input to the interpolation circuit portion 81 and a ratio between the output counts of "+1" and "−1" described above.

The oscillation circuit may include an oven-controlled crystal oscillator (OCXO) or a temperature-compensated crystal oscillator (TCXO). In the case of the TCXO, a compensation signal corresponding to a detection result of a temperature detector is added to the frequency setting signal (output signal from the adder 30) obtained as described above, and the result is input to the DDS 11.

In the embodiment described above, the value for designating the frequency setting value is output as a 24-bit digital value. Therefore, it is possible to address problems such as voltage instability generated when a frequency is set based on an analog DC voltage or an output noise problem caused by a noise in a control signal line. Accordingly, it is possible to perform an accurate frequency control and obtain high frequency stability.

In addition, the value for designating the frequency setting value is output as a 36-bit digital value, this digital value is divided into higher-order bits and lower-order bits, and the first value "+1" and the second value "−1" different from each other is output in synchronization with a clock signal. The first and second values are added to the higher-order bits, and the output counts of the first and second values are determined based on the aforementioned ratio corresponding to the digital value of the lower-order bits. Therefore, as described above, it is possible to obtain a resolution higher than that of the frequency setting value set by a 24-bit digital value while the 24-bit digital value is used. As a result, it is possible to obtain a high resolution for the setting frequency with a small number of bits. Therefore, it is possible to suppress an increase of a circuit size.

In the example described above, the 32-bit digital value as the value for designating the frequency setting value is output from the second register 41 as a setting value output portion. In addition, a parameter for the interpolation value corresponding to the lower-order 8-bit digital value is output from the interpolation circuit portion 81. The number of bits (value for designating the frequency setting value) for obtaining a resolution of the setting frequency of the frequency synthesizer is not limited to 32 bits. Preferably, the number of bits is equal to or larger than 16 bits.

Furthermore, the first and second values output from the interpolation circuit portion 81 are not limited to "−1" and "+1," but may be set to other values if the same effects of this disclosure can be obtained. For example, the first and second values may have the same sign, or the absolute values of the first and second values may be different.

A clock for latching the timing of outputting the first and second values from the interpolation circuit portion 81 has a frequency of 8 Hz in the aforementioned description. However, in practice, the clock may be set to, for example, 26.1 MHz. The operational clock of the DDS 11 may be set to, for example, 26.1 MHz, and the normal frequency may be set to, for example, 38.88 MHz.

Advantages of the embodiment disclosed here will be described.

A digital value corresponding to a normal frequency is output using the first register 3 as a normal frequency output portion, and a digital value for a frequency adjustment factor with respect to the normal frequency is generated as a value obtained by multiplying a gain and a frequency adjustment factor expressed as a frequency ratio. This multiplication value is added to the normal frequency, and the result is set as a frequency setting signal. In addition, the gain is determined such that a variable range of the digital value as the frequency adjustment factor matches a frequency variable width expressed as a frequency ratio. Therefore, according to the embodiment disclosed here, for example, a manufacturer can set the variable width expressed as the frequency ratio depending on a use range of the oscillation frequency using an upper-layer computer 6, and a user can set a frequency with high resolution within the variable width. Accordingly, it is possible to cope with various specifications for a frequency adjustment range without changing a hardware configuration.

That is, by obtaining a sufficiently wide bit width of the digital value corresponding to the frequency adjustment factor, it is possible to obtain high accuracy in the frequency setting.

Since the frequency adjustment is performed using a digital value, it is possible to avoid an influence from an electronic noise that may be generated when an analog signal is used and address an instable frequency problem caused by aging of an analog element or a temperature characteristic change. For this reason, the embodiment disclosed here is suitably applied to a system that requires high frequency stability and highly stable frequency control, such as a global positioning system (GPS). Furthermore, since the frequency adjustment factor is determined by setting a digital value in the register 41, it is possible to obtain excellent linearity between a frequency setting input value and a frequency setting signal input to the oscillation circuit portion and excellent linearity between a frequency setting input value and an output frequency, compared to a case where a frequency is set using an analog circuit.

Here, a method of writing a digital value to each of the registers 3, 41, 42, and 43 is not limited to a method of reading from the external memory 51. Instead, the digital value may be directly written from an upper-layer computer using an interface 52.

Moreover, a user may change the variable frequency width.

Various configurations may be employed as the oscillation circuit portion according to the embodiment disclosed here if the output frequency is determined depending on the frequency setting signal.

Figure 9:
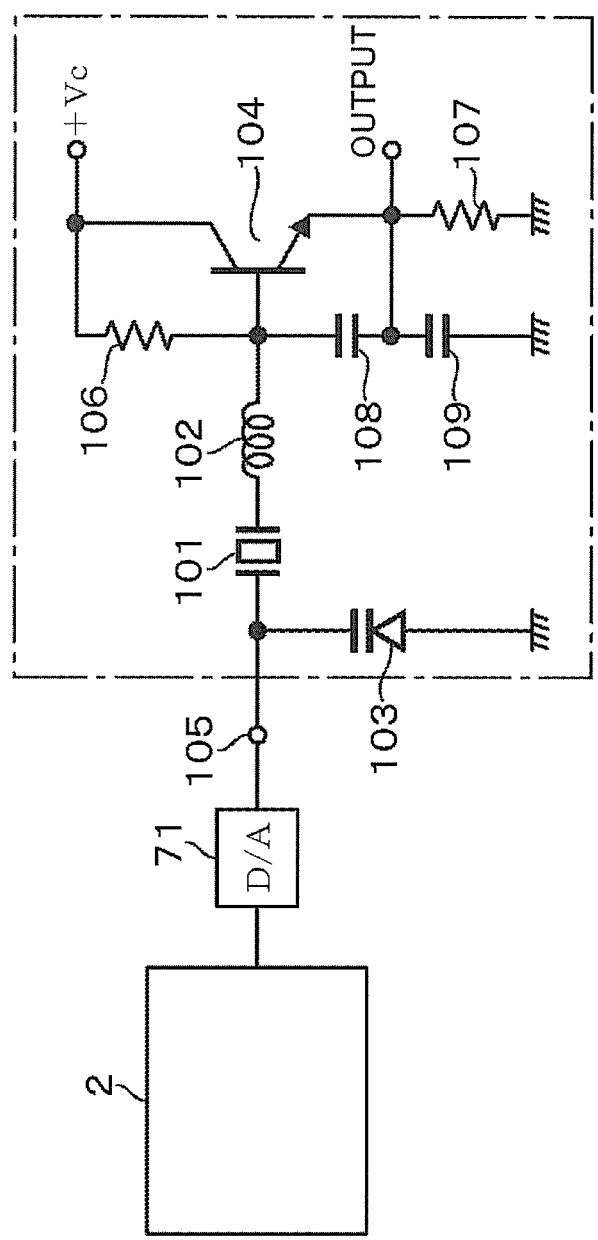
FIG. 9 is a circuit diagram illustrating another embodiment of this disclosure.
Figure 10:
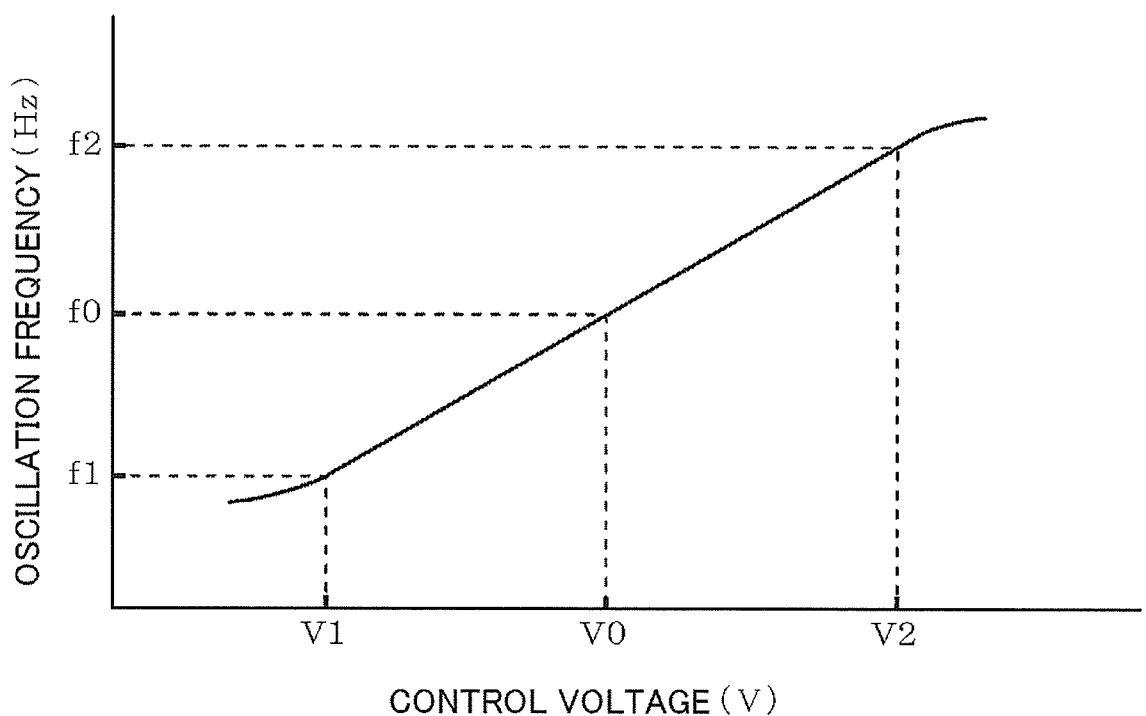
FIG. 10 is a characteristic diagram illustrating a relationship between an oscillation frequency (output frequency) and a control voltage of an oscillator of the related art.

FIG. 9 illustrates an example in which a Colpitts oscillation circuit is employed as the oscillation circuit portion. This circuit includes a crystal vibrator 101, an inductor 102, an oscillation portion having, for example, a varicap diode 103 as a voltage-controlled variable capacitance element, and a transistor 104 as an amplifier. In this circuit, a capacitance of the varicap diode 103 changes to set the oscillation frequency by inputting an analog control voltage to a control input terminal 105. Reference numerals 106 and 107 denote resistors, and reference numerals 108 and 109 denote capacitors. Reference numeral 7 denotes an oscillation circuit portion. In this example, a digital-analog converter 71 is provided between an output terminal (output terminal of the adder 30) of the frequency setting signal of the microcontroller 2 of FIG. 1 and the control input terminal 105. The digital-analog converter 71 converts the frequency setting signal as a digital value into an analog signal and input the analog signal into the control input terminal 105. In this example, the effects similar to those described in the aforementioned embodiment can be obtained.

Instead of the Colpitts circuit, the oscillation circuit portion may include any other oscillation circuit such as a Pierce circuit, a Clapp circuit, and a Butler circuit.

Here, the variable frequency width expressed as a frequency ratio may have a different width between the positive and negative sides with respect to the normal frequency instead of the same width. Specifically, in the embodiment described above, the variable width is set to "±5 ppm" with respect to the normal frequency. However, the variable width may be set to, for example, "−4 ppm" and "+6 ppm" with respect to the normal frequency.

Such a frequency setting may be performed, for example, by providing a subsidiary register in addition to the configuration of FIG. 1. For example, assuming that the variable width is set to "±5 ppm" with respect to the normal frequency, a digital value corresponding to "+1 ppm" may be set in the subsidiary register, and the digital value from the subsidiary register may be added to the digital value output from the second register 41, so that the gains G1 and G2 are multiplied to the addition value. In this case, if the digital value of the second register 41 changes from the minimum value to the maximum value, a variable width of "−4 ppm" to "+6 ppm" is obtained because the frequency adjustment factor of "+1 ppm" is added.

Although the register is used as the normal frequency output portion, the frequency adjustment factor output portion, and the gain output portion in the embodiment of FIG. 1, other memory elements such as a random access memory (RAM) may also be employed without limiting to the register.

Furthermore, although a crystal vibrator is employed as an oscillator in the oscillation circuit portion in the embodiment disclosed here, other elements such as an LC oscillation circuit (including an inductor and a conductor) may also be employed as the oscillator.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillator configured to receive a frequency setting value input to an oscillation circuit portion and obtain a frequency output corresponding to the frequency setting value from the oscillation circuit portion, the oscillator comprising:
   a normal frequency output portion that outputs a digital value corresponding to a normal frequency;
   a frequency adjustment factor output portion that outputs a digital value corresponding to a frequency ratio to set a frequency adjustment factor with respect to the normal frequency based on the frequency ratio;
   an interpolation circuit portion that performs interpolation for a digital value of lower-order bits out of the digital value output from the frequency adjustment factor output portion;
   a first adder that adds an output value of the interpolation circuit portion and a digital value of higher-order bits out of the digital value output from the frequency adjustment factor output portion to output an addition value for designating the frequency setting value,
   a gain output portion that outputs a digital value corresponding to a gain to be multiplied to the addition value output from the first adder;
   a multiplier that multiplies the gain output from the gain output portion by the addition value output from the first adder; and
   a second adder that adds the digital value output from the normal frequency output portion and a digital value output from the multiplier and outputs an addition value as a frequency setting signal,
   wherein a signal output from the interpolation circuit portion is sequential data having first and second values different from each other and output in synchronization with a clock signal, and
   output counts of the first and second values are determined based on a ratio corresponding to the digital value of the lower-order bits,
   wherein a lower limit of a variable frequency width represented as a frequency ratio is allocated to a minimum value of the digital value that is capable of being set in the frequency adjustment factor output portion,
   an upper limit of the variable frequency width represented as a frequency ratio is allocated to a maximum value of the digital value that is capable of being set in the frequency adjustment factor output portion.

2. The oscillator according to claim 1, wherein a frequency of the clock signal used in the interpolation circuit portion is lower than an output frequency of the oscillator.

3. The oscillator according to claim 1, wherein the oscillation circuit portion has a direct digital synthesizer (DDS) that receives the frequency setting value and a phase-locked loop (PLL) that receives a reference signal generated based on an output of the DDS.

4. The oscillator according to claim 1, wherein the gain output from the gain output portion includes a first gain greater than "1" and a second gain which is an inverse number of an exponent of "2,"
   an output value of the multiplier is obtained by multiplying the digital value output from the frequency adjustment factor output portion by the first and second gains.

5. The oscillator according to claim 1, wherein one of the first and second values is "−1" in a decimal expression, and the other value is "+1" in a decimal expression.

6. The oscillator according to claim 1, wherein the interpolation circuit portion includes:
   a delta sigma circuit that generates a pulse width modulation (PWM) signal having an average value of a duty ratio for a predetermined time equal to a value corresponding to the digital value of the lower-order bits, and
   a circuit that outputs the first value as one of a high level L and a low level L of the PWM signal and outputs the second value as the other level.

7. The oscillator according to claim 1, wherein the digital value output from the frequency adjustment factor output portion is a 32-bit digital value, and the lower-order bits are lower-order 8 bits out of the 32 bits.

* * * * *